United States Patent [19]
Kidoh

[11] Patent Number: 6,147,574
[45] Date of Patent: Nov. 14, 2000

[54] UNIDIRECTIONAL SURFACE ACOUSTIC WAVE TRANSDUCER AND TRANSVERSAL-TYPE SAW FILTER HAVING THE SAME

[75] Inventor: Hideo Kidoh, Kanazawa, Japan

[73] Assignee: Murata Manufacturing Co., Ltd., Japan

[21] Appl. No.: 09/196,457

[22] Filed: Nov. 19, 1998

[30] Foreign Application Priority Data

Nov. 20, 1997 [JP] Japan ................................ 9-319653
Dec. 26, 1997 [JP] Japan ................................ 9-360511

[51] Int. Cl.[7] .................... H03H 9/145; H03H 9/64
[52] U.S. Cl. .............. 333/195; 310/313 B; 310/313 D
[58] Field of Search .............................. 333/193–196; 310/313 R, 313 B, 313 C, 313 D

[56] References Cited

U.S. PATENT DOCUMENTS

| | | | |
|---|---|---|---|
| 4,353,046 | 10/1982 | Hartmann | 310/313 D |
| 4,642,506 | 2/1987 | Lewis | 310/313 D |
| 4,910,839 | 3/1990 | Wright | 310/313 B |
| 5,073,763 | 12/1991 | Wright | 333/196 X |
| 5,264,751 | 11/1993 | Dufilie et al. | 310/313 D |
| 5,274,345 | 12/1993 | Gau | 333/195 X |
| 5,313,177 | 5/1994 | Hickernell et al. | 333/195 X |
| 5,550,793 | 8/1996 | Dufilie | 310/313 D |
| 5,663,695 | 9/1997 | Tanaka et al. | 333/195 X |
| 5,703,427 | 12/1997 | Solal et al. | 310/313 D |

FOREIGN PATENT DOCUMENTS

| | | |
|---|---|---|
| 2-45364 | 9/1990 | Japan . |
| WO 94/22217 | 9/1994 | WIPO ............... 333/195 |

OTHER PUBLICATIONS

C.S. Hartmann & B.P. Abbott: "Overview of Design Challenges For Single Phase Unidirectional Saw Filters", *Proc. IEEE Ultrasonics Symposium* (1989) pp. 79–89.

M.F. Lewis: "Low Loss Saw Devices Employing Single Stage Fabrication", *Proc. IEEE Ultrasonics Symposium* (1983) pp. 104–108.

K. Yamanouchi and H. Furuyashiki: "Low Loss Saw Filter Using Internal Reflection Types of New Single-Phase Unidirectional Transducer", *Proc. IEEE Ultrasonics Symposium*, (1984) pp. 68–71.

*Primary Examiner*—Robert Pascal
*Assistant Examiner*—Barbara Summons
*Attorney, Agent, or Firm*—Keating & Bennett LLP

[57] ABSTRACT

A unidirectional surface acoustic wave transducer includes a plurality of interdigital transducers and a plurality of reflectors disposed on a piezoelectric substrate. The directivity of a first group of the plurality of reflectors is opposite relative to the directivity of a second group of the plurality of reflectors.

8 Claims, 7 Drawing Sheets

UNIDIRECTIONAL SURFACE ACOUSTIC WAVE TRANSDUCER AND TRANSVERSAL-TYPE SAW FILTER HAVING THE SAME

BACKGROUND OF THE INVENTION

1. Field of the Invention

The present invention relates to a unidirectional surface acoustic wave transducer, for use in a surface acoustic wave filter or the like, and more specifically, the present invention relates to a surface acoustic wave transducer in which modification of the directivity of reflectors achieves greatly improved transmission characteristics. The present invention also relates to a transversal-type surface acoustic wave filter having such a unidirectional surface acoustic wave transducer.

2. Description of the Related Art

Recently, with advanced digitalization in the telecommunication area, there has been a demand for a surface acoustic wave filter having reduced insertion loss and good phase linearity. Conventional types of surface acoustic wave filters include a transversal-type surface acoustic wave filter and a resonator-type surface acoustic wave filter.

The conventional transversal-type surface acoustic wave filter has a problem in that insertion loss is large, although phase linearity is satisfactory.

On the other hand, the resonator-type surface acoustic wave filter has a problem in that phase linearity is unsatisfactory, although insertion loss is small.

Accordingly, as a surface acoustic wave filter having both reduced insertion loss and satisfactory phase linearity, there has been proposed a surface acoustic wave filter, which includes a single-phase unidirectional surface acoustic wave transducer (hereinafter referred to as a SPUDT). Various structures of a conventional type of SPUDT are presented, such as an EWC type, a reflection-bank type, a FEUDT. See for example, C. S. Hartmann and B. P. Abbott: Proc. IEEE Ultrasonics Symposium (1989) pp. 79–89; M. F. Lewis: Proc. IEEE Ultrasonics Symposium (1983) pp. 104–108; K. Yamanouchi and H. Furuyashiki: Proc. IEEE Ultrasonics Symposium (1984) pp. 68–71, Japanese Examined Patent Publication No. 2-45364, etc.

In such a type of SPUDT, directivity is provided by shifting the reflection center of the reflector only by $\lambda/8$ ($\lambda$ represents wavelength of a surface acoustic wave in a center frequency) from the excitation center of an interdigital electrode transducer (hereinafter referred to as an IDT) in the direction of propagation of the surface acoustic wave, so that bi-directional loss, which is typical of the transversal-type surface acoustic wave filter, is reduced.

Currently, however, an IF filter used in telecommunication devices, particularly, in CDMA (Code Division Multiple Access) devices, is required to have higher selectivity, and a rapid change in attenuation in a region between a pass band and a block band. To this end, it is necessary only that the number of pairs of electrode fingers in an IDT be increased. Meanwhile, as electronic devices are miniaturized, surface acoustic wave filters that are to be mounted therein must be made smaller. As a result, it is difficult to increase the number of pairs of electrode fingers in the IDT.

Since the number of pairs of electrode fingers in the IDT cannot be increased by much, the conventional type of surface acoustic wave filter makes only a slight change in attenuation between the pass band and the block band, failing to satisfy the requirements for the filter characteristics. In addition, the conventional filters present problems in that manufacturing tolerance is undesirably restricted thereby reducing manufacturing yield.

SUMMARY OF THE INVENTION

To overcome the problems described above, the preferred embodiments of the present invention provide a surface acoustic wave transducer which has a significantly reduced size and makes a rapid change in attenuation between the pass band and the block band, thereby achieving exceptionally higher selectivity.

In addition, preferred embodiments of the present invention provide a transversal-type surface acoustic wave filter including a surface acoustic wave transducer which has a significantly reduced size and makes a rapid change in attenuation between the pass band and the block band, thereby achieving exceptionally higher selectivity.

A unidirectional surface acoustic wave transducer according to a preferred embodiment of the present invention includes a plurality of interdigital transducers and a plurality of reflectors disposed on a piezoelectric substrate, wherein the directivity of a first group of the plurality of reflectors is opposite relative to the directivity of a second group of the plurality of reflectors.

Center positions of electrode fingers of the first group of the reflectors are preferably shifted by about $\lambda/8$ in a first direction which is substantially perpendicular to the electrode fingers from the center position of electrode fingers of the interdigital transducers, where $\lambda$ represents a wavelength corresponding to a center frequency of a surface acoustic wave excited by the transducer, while center positions of electrode fingers of the second group of the reflectors are preferably shifted by about $\lambda/8$ from the center position of electrode fingers of the interdigital transducers in a second direction which is opposite to the first direction.

The surface acoustic wave transducer may further include a dummy electrode located between the plurality of interdigital transducers.

The transversal-type surface acoustic wave filter according to a preferred embodiment of the present invention includes a surface acoustic wave substrate, an input-side unidirectional transducer provided on the surface acoustic wave substrate, and an output-side unidirectional transducer provided on the surface acoustic wave substrate and arranged to extend in a direction in which a surface acoustic wave excited by the input-side unidirectional transducer propagates. The output-side unidirectional transducer includes a plurality of interdigital transducers, a first reflector having a forward directivity and a second reflector having a reverse directivity.

The first reflector is preferably disposed between the input-side unidirectional transducer and the second reflector. Further, each of the first reflector, the second reflector, and the plurality of interdigital transducers preferably includes a plurality of electrode fingers. The center positions of the electrode fingers of the first reflector are preferably shifted by about $\lambda/8$ from the center position of the electrode fingers of the interdigital transducers toward a side where the input-side unidirectional transducer is provided, where $\lambda$ represents a wavelength corresponding to a center frequency of a surface acoustic wave excited by the transducer, while center positions of the electrode fingers of the second reflector are preferably shifted by about $\lambda/8$ from the center position of the electrode fingers of the interdigital transducers toward a side where the input-side unidirectional transducer is not provided.

Each electrode finger of the interdigital transducers may include a pair of split electrode fingers. In such a case, the center position of the electrode fingers of the interdigital transducers is a center of the pair of split electrode fingers.

The transversal-type surface acoustic wave filter may further includes a dummy electrode which includes a plurality of electrode fingers. Further, each of the electrode fingers of the first reflector, the second reflector and the dummy electrode may be electrically connected at the both ends thereof within the first reflector, the second reflector and the dummy electrode, respectively.

In addition, the input-side unidirectional transducer may include a plurality of interdigital transducers, a first reflector having a forward directivity and a second reflector having a reverse directivity.

According to preferred embodiments of the present invention, in the SPUDT having a plurality of IDTs and a plurality of reflectors on a piezoelectric substrate, since the directivity of the first group of the plurality of reflectors is opposite relative to the directivity of the second group of the plurality of reflectors, the reflection wave generated by each of the forward reflectors overlaps a surface acoustic wave that is excited by an IDT and travels forward to another IDT in phase, while the reflection wave generated by each of the reverse reflectors overlaps the above surface acoustic wave that is excited by an IDT and travels forward to another IDT in opposite phase. Accordingly, this causes a change in attenuation between the pass band and the block band to be rapid, selectivity to be greatly improved, manufacturing tolerance to be increased sufficiently, and yield to be largely reduced.

Therefore, the small-sized and low-loss SPUDT can provide higher selectivity and stability in manufacturing.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, the preferred embodiments of the present invention are explained in detail with reference to the drawings.

Figure 1:
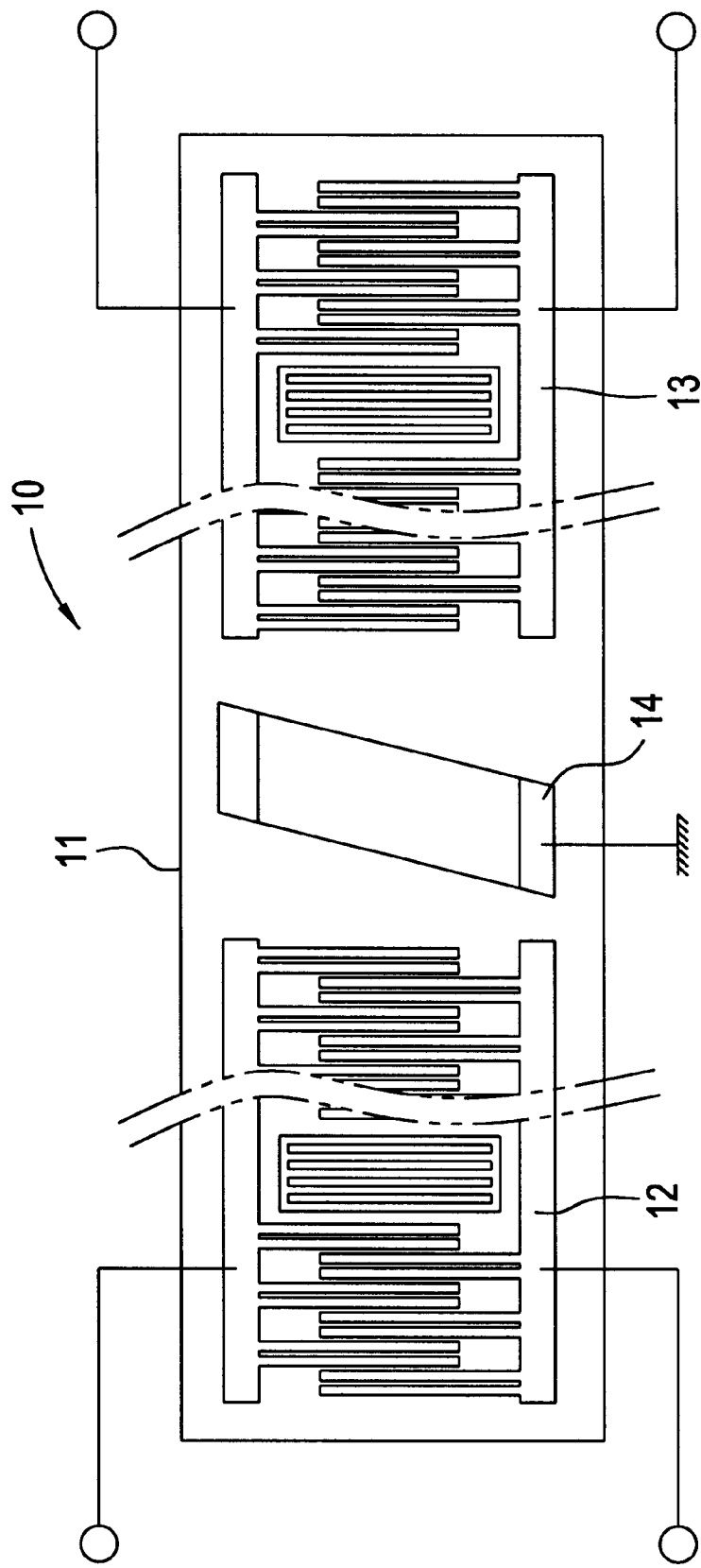
FIG. 1 is a schematic plan view illustrating a transversal-type surface acoustic wave filter according to a preferred embodiment of the present invention.

As shown in FIG. 1, a transversal-type surface acoustic wave filter 10 according to a preferred embodiment of the present invention includes a surface acoustic wave substrate 11, an input-side single-phase unidirectional transducer (SPUDT) 12 and an output-side SPUDT 13. The input-side SPUDT 12 and the output-side SPUDT 13 are provided on the surface acoustic substrate 11 and arranged so has to be separated by a predetermined interval along the direction in which the surface acoustic waves excited by the input-side SPUDT 12 propagate. The transversal-type surface acoustic wave filter 10 further includes a shield electrode 14 located between the input-side SPUDT 12 and the output-side SPUDT 13 so as to prevent an electromagnetic wave from directly propagating from the input-side SPUDT 12 toward the output-side SPUDT 13.

The input-side SPUDT 12 includes a plurality of IDTs and reflectors which are arranged to have a conventional structure provided with a forward directivity, as explained above. Note that the forward direction in the input-side SPUDT. 12 is the direction from the input-side SPUDT 12 toward the output-side SPUDT 13 as far as the input-side SPUDT 12 is concerned.

The surface acoustic wave substrate 11 may be made of one of known various piezoelectric materials or the like. The input-side SPUDT 12, the output-side SPUDT 13 and the shield electrode 14 are preferably made of aluminum, but may be made of other materials such as tantalum or the like.

Figure 2:
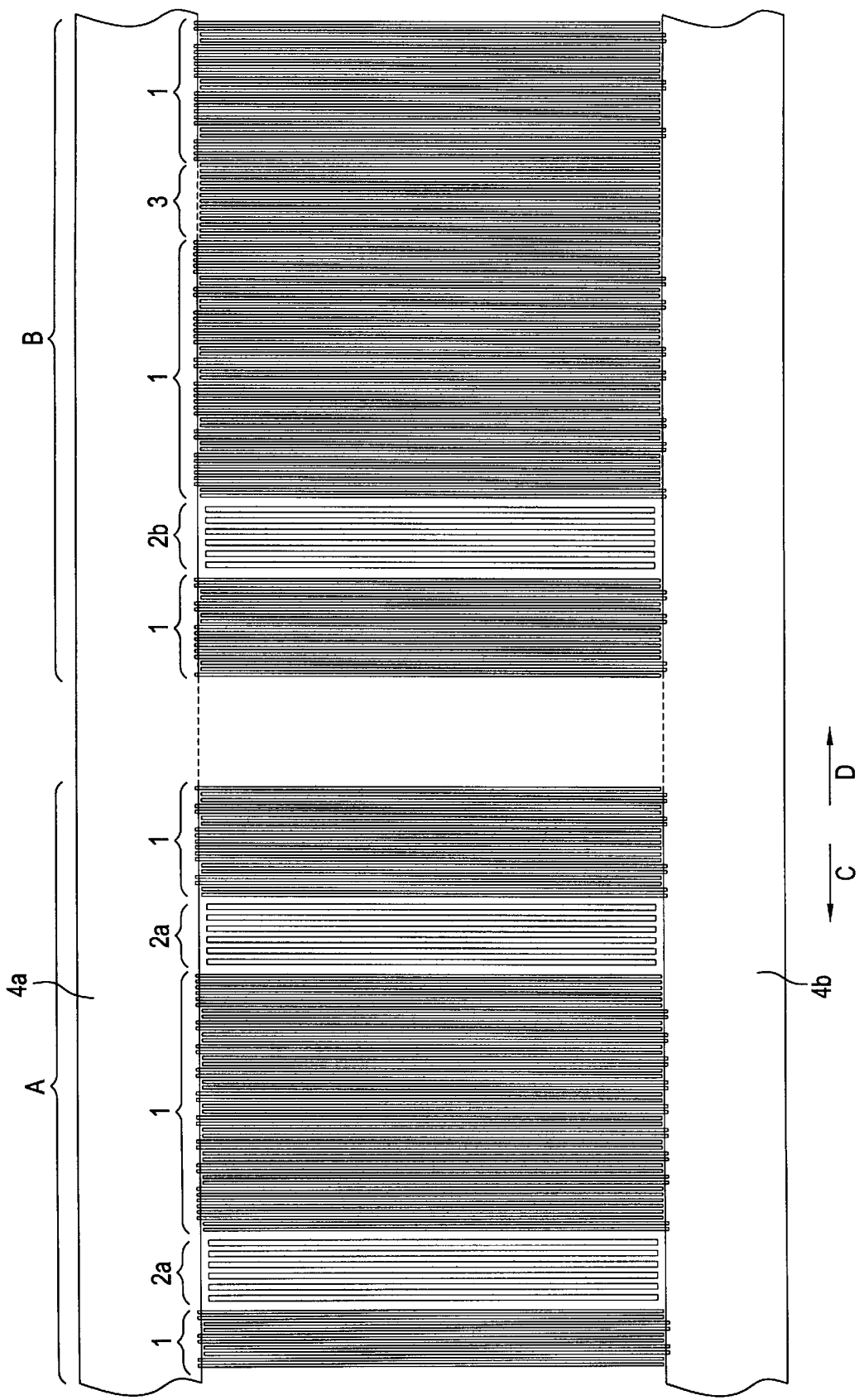
FIG. 2 is a schematic plan view illustrating an electrode structure of a SPUDT used in transversal-type surface acoustic wave filter shown in FIG. 1.
Figure 3:
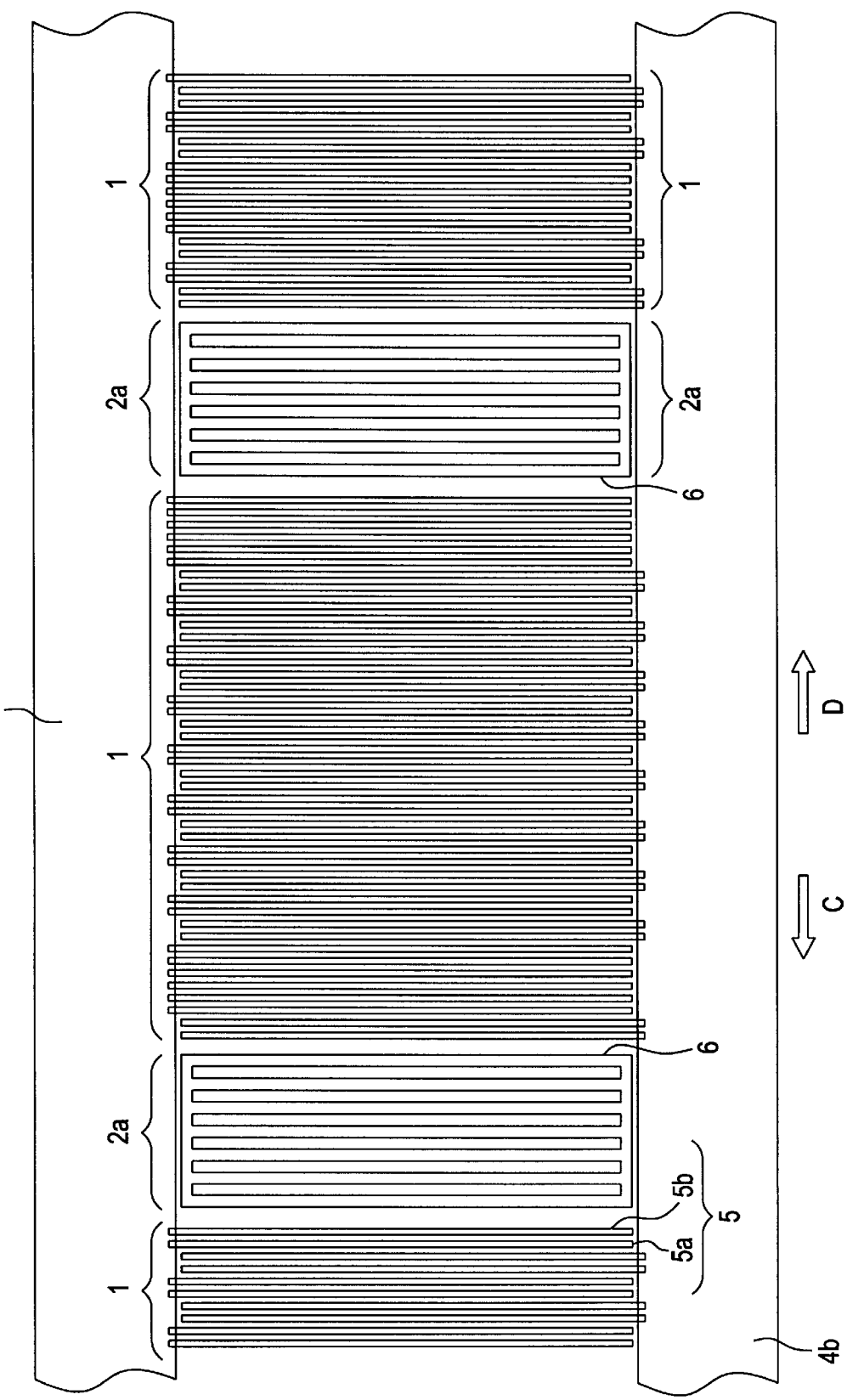
FIG. 3 is an enlarged plan view of the part indicated by Region A in FIG. 2.
Figure 4:
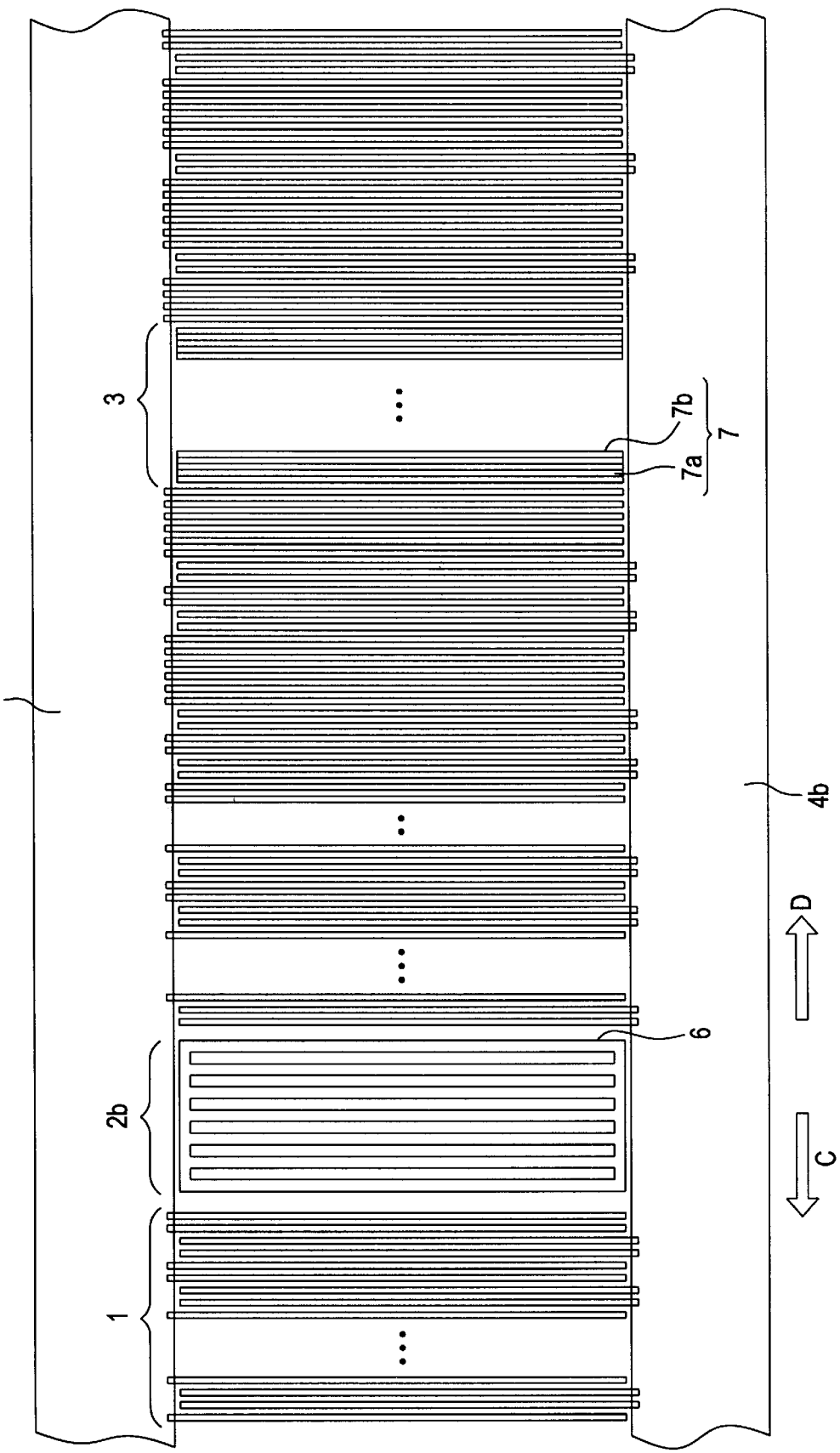
FIG. 4 is an enlarged plan view of the part indicated by Region B in FIG. 2.

FIG. 2 is a partially cut-away plan view of the output-side SPUDT 13 and FIGS. 3 and 4 are each schematic plan views, which are enlargements of the parts indicated by A and B in FIG. 2. One of the essential features of preferred embodiments of the present invention is that the output-side SPUDT 13 has a unique structure as explained hereinafter.

The output-side SPUDT 13 shown, in part, in FIG. 2 is a reflection-bank type transducer. The input-side SPUDT 12 is located on the left-side area of FIG. 2, and the direction C extending towards the left side represents a first direction (forward direction), while the direction D represents a second direction (reverse direction) as far as the output-side SPUDT 13 is concerned.

In the outside SPUDT 13 shown in FIG. 2, a plurality of IDTs 1 are arranged to extend in the direction in which a surface acoustic wave propagates. Reflectors 2a and 2b are disposed between the IDTs 1 or a dummy electrode 3 is disposed between the IDTs 1. The reflector 2b is located farther from the input-side SPUDT 12 than the reflectors 2a so that the reflectors 2a are disposed between the reflector 2b and the input-side SPUDT 12.

The above-mentioned IDTs 1, reflectors 2a, 2b, and a dummy electrode 3 are disposed between a pair of bus bars 4a and 4b which extend in the direction in which the surface acoustic wave propagates and are arranged substantially parallel with each other having a specified distance therebetween.

An IDT 1 has a structure in which a plurality of electrode fingers, ends of which are connected to the bus bar 4a, and a plurality of electrode fingers, ends of which are connected to the bus bar 4b, are mutually interdigitated. In this preferred embodiment, each of the electrode fingers preferably has a split electrode structure including two split electrode fingers extending in a direction that is substantially perpendicular to the direction in which the surface acoustic wave propagates. Accordingly, considering an electrode finger 5 in FIG. 3 for purposes of explanation, the electrode finger 5 is composed of split electrode fingers 5a and 5b.

The width of each split electrode finger of the IDTs 1 and the space between the split electrode fingers of the same are preferably set to about $\lambda/8$.

The reflectors 2a and 2b have, as shown in FIGS. 3 and 4, a plurality of electrode fingers 6, which are electrically connected to each other at both ends, and are electrically isolated form the bus bars 4a and 4b. The width of an electrode finger of the reflectors 2a and 2b and the space between the electrode fingers of the same are preferably set to about $\lambda/4$.

Figure 5:
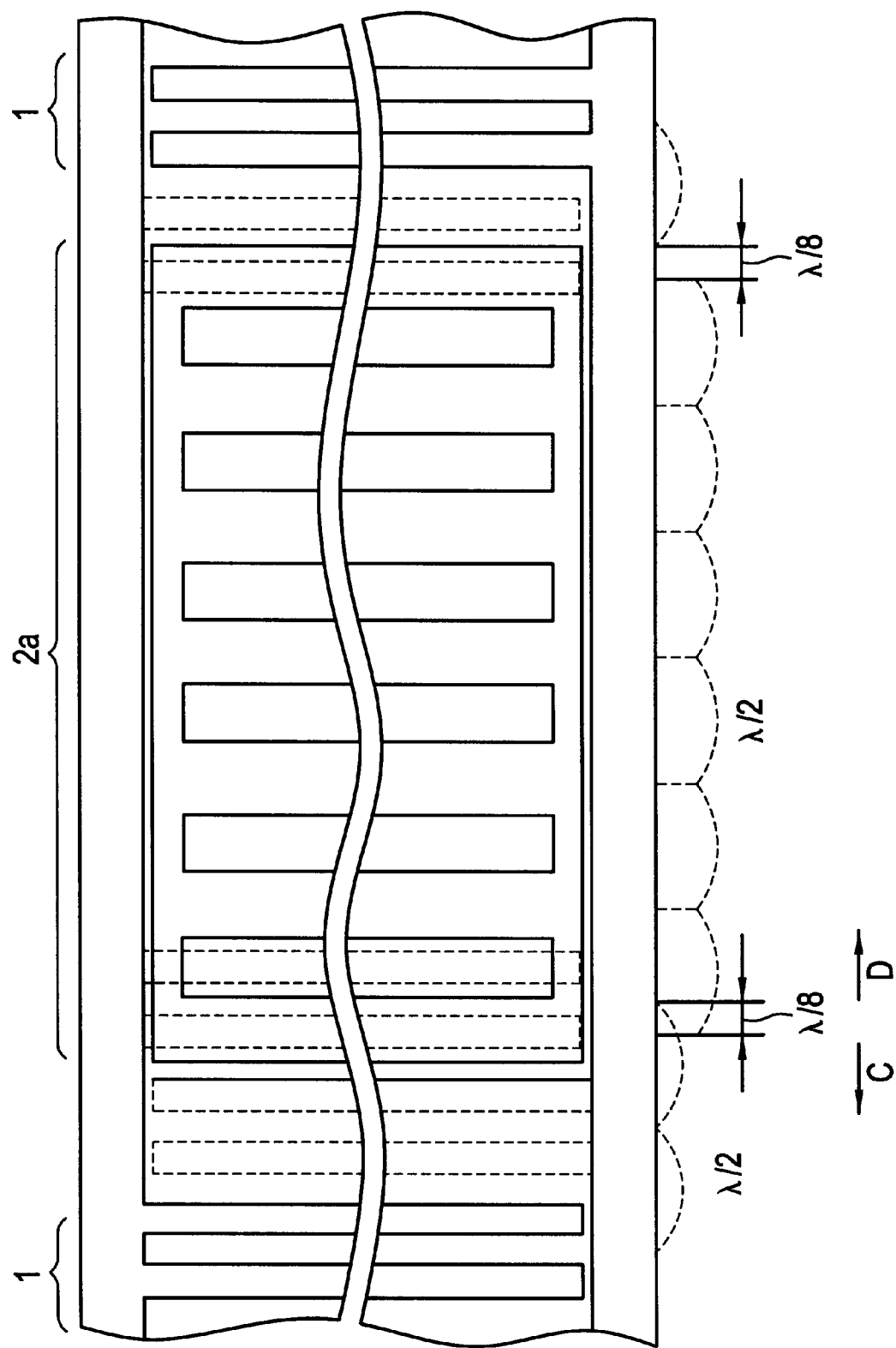
FIG. 5 is a schematic enlarged view illustrating the positional relationships between reflectors having forward directivity and IDTs adjacent thereto in the SPUDT shown in FIG. 2.
Figure 6:
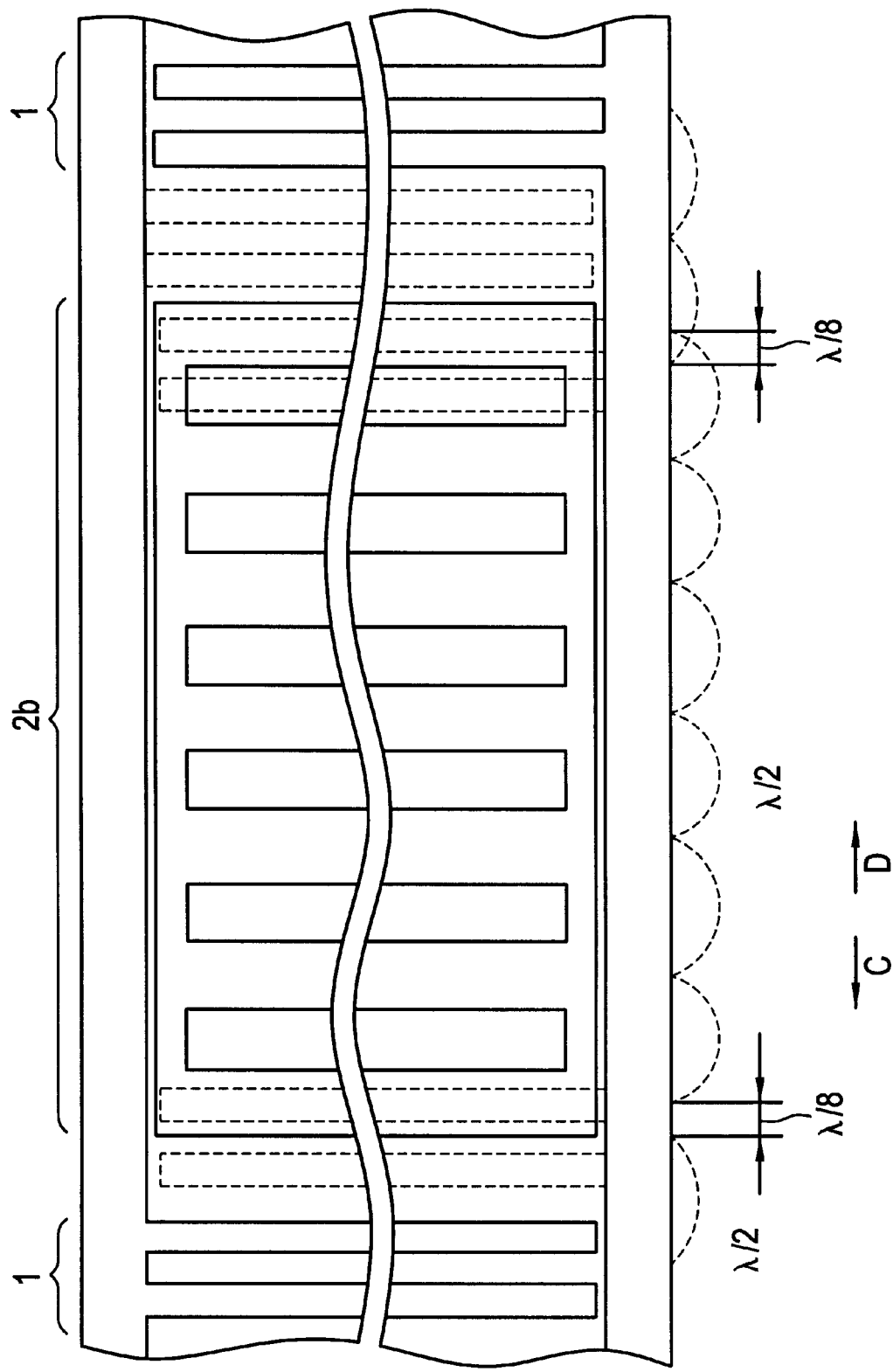
FIG. 6 is an schematic enlarged view illustrating the positional relationships between a reflector having reverse directivity and IDTs adjacent thereto in the SPUDT shown in FIG. 2.

FIGS. 5 and 6 are schematic enlarged views illustrating the positional relationships between reflectors 2a and the IDT 1 and between the reflector 2b and the IDT 1, respectively. As shown in FIGS. 5 and 6, each pair of the split electrodes of the IDTs 1 is arranged with an interval of about $\lambda/2$. The electrode fingers of the reflectors 2a and 2b also are arranged to have an interval of about $\lambda/2$. However, as shown in FIG. 5, the electrode centers of the electrode fingers of the reflectors 2a are shifted by about $\lambda/8$ from the electrode centers of the split electrodes of the IDTs 1 in the forward direction C. As a result, due to the propagation path difference between the reflected wave and the direct wave, on the side where the input-side SPUDT 12 is provided (left side in FIG. 2) with respect to the reflector 2a, the surface acoustic wave propagating in the direction C is greatly enhanced by the wave reflected by the reflector 2a while on the other side where no input-side SPUDT 12 is provided (right side in FIG. 2) with respect to the reflector 2a, the surface acoustic wave propagating in the direction D is attenuated by the wave reflected by the reflector 2a.

On the other hand, as shown in FIG. 6, the electrode centers of the electrode fingers of the reflector 2b are shifted by about $\lambda/8$ from the electrode centers of the split electrodes of the IDTs 1 in the forward direction D. As a result, on the side where the input-side SPUDT 12 is provided (left side in FIG. 2) with respect to the reflector 2b, the surface acoustic wave propagating in the direction C is attenuated by the wave reflected by the reflector 2b while on the other side where no input-side SPUDT 12 is provided (right side in FIG. 2) with respect to the reflector 2b, the surface acoustic wave propagating in the direction D is greatly enhanced by the wave reflected by the reflector 2b.

As shown in FIG. 4, the dummy electrode 3 is arranged as an alternative to the reflectors 2a and 2b and has a plurality of dummy electrode fingers 7, which are electrically connected to each other at both ends. Each of the dummy electrode fingers 7 has a split electrode structure; namely, as in the case of the electrode fingers of an IDT 1, each of the dummy electrode fingers 7 is preferably composed of two split electrode fingers 7a and 7b.

The width of each of the split electrode fingers 7a and 7b and the space between the electrodes 7a, 7b in the dummy electrode 3 are preferably about $\lambda/8$.

FIG. 2 shows a part of the above output-side SPUDT 13 according to a preferred embodiment of the present invention. In the output-side SPUDT 13, there are formed a plurality of groups of elements extending in the direction in which a surface wave propagates, where a group is composed of at least an IDT and at least a reflector 2a or 2b; and when each of the plurality of groups is designated as a first, second or third group in the direction in which a surface acoustic wave propagates, the reflector in the third group is a reflector 2b, while each of the reflectors in the first and second groups is a reflector 2a.

More specifically, the left side of FIG. 2 corresponds to the center part of the output-side SPUDT 13, on which a first group and a second group having an IDT 1 and a reflector 2a are provided. On the right side, a third group having an IDT 1 and a reflector 2b is provided. Also, on the left side of the first group described above, another first group having an IDT 1 and a reflector 2a is provided, although it is not shown in the figure.

Furthermore, a fourth group is arranged on the outside of the third group and includes an electrode structure including an IDT1 and a dummy electrode 3. Also, on the further left side of the first group arranged on the left side in FIG. 2 another fourth group including the reflector 1 and the dummy electrode 3, which are mentioned above, is disposed although it is not shown in the figure.

According to the transversal-type SAW filter 10, the reflector 2a of each of the first and second groups at the center is a reflector having a forward directivity. A reflection wave made by the reflector 2a becomes in phase with a surface acoustic wave that is excited by an IDT 1 and travels forward to the input-side SPUDT 12 so as to overlap each other. On the other hand, the reflection wave made by the reflector 2b becomes opposite in phase with a surface acoustic wave that is excited by an IDT 1 and travels forward to the input-side SPUDT 12 so as to overlap each other.

Therefore, as clearly shown in an example of preferred embodiments, which example is described below, regarding the reflectors 2a and 2b, the directivity of the first group of reflectors 2b is opposite to the second group of reflectors 2a, so that a change in attenuation between the pass band and the block band is very rapid, thereby greatly expanding the width of band and improvement of selectivity.

Further, with a finite-element method, or the like, the difference of acoustic velocity between a solid electrode (an electrode including an electrode finger with a structure in which two split electrode fingers are united) and the above-described split electrode finger is calculated; then, a distance between an IDT 1 of a group having a reflector 2a or 2b and an IDT 1 of a second or a third group adjacent to that is made larger, by a degree equal to the difference of acoustic velocity, than an integral multiple of $0.5\lambda$. This permits the difference of acoustic velocity between an IDT1 and a reflector 2a or 2b to be corrected.

In each of the above fourth groups of this preferred embodiment, a dummy electrode 3 is provided. The dummy electrode 3 in the fourth group, similar to an IDT 1, has a structure of split electrode fingers, which does not allow acoustic reflections to be generated, so that the sound velocity of the surface acoustic wave in an area where the dummy electrode 3 is arranged can be the same as that in the other parts in the fourth group.

In addition, since the reflectors 2a, 2b, and the dummy electrode 3 have a structure in which a plurality of electrode fingers are mutually connected at both ends to be short-circuited, the reflectors 2a, 2b and the dummy electrode 3 do not generate an electric re-excited wave. The reflectors 2a and 2b only generate acoustic reflection, while the dummy electrode 3 does not generate reflection, so that this permits unnecessary spurious emission to be reduced.

Next, a description will be given of the details of an example of a preferred embodiment of the present invention.

In the SPUDT 13 of FIGS. 1 and 2, the used IDTs 1 are symmetrically weighted by a withdrawal-weighting method. The number of pairs of electrode fingers in an IDT 1 is set at 10.5, the number of electrode fingers in each of reflectors 2a and 2b is set at 7, the number of pairs of electrode fingers in a dummy electrode 3 is set at 3.5, and the total number of units composed of an IDT 1, and reflectors 2a, 2b, or a dummy electrode 3 is set at 21. As for the units that include reflectors 2a or 2b, 9 units are arranged at the center in the direction in which a surface wave propagates, and among the 9 units, the outermost unit belongs to the third group, while the other 8 units belong to the above-mentioned first group. Also, each of the 6 units, which are arranged respectively on the left and right sides of the 9 units, namely, a total of 12 units belong to the fourth group having a dummy electrode 3.

The distance between an IDT 1 of a unit that includes a dummy electrode 3 and an adjacent IDT 1 is $4.5\lambda$, while the distance between an IDT of a unit that includes a reflector 2a or 2b and an IDT of an adjacent unit is $5.5\lambda$.

On the other hand, also in the input-side SPUDT 12 arranged at a specified distance from the output-side SPUDT 13, IDTs which are symmetrically weighted by a withdrawal-weighting method, reflectors, and dummy electrodes are disposed in the direction in which a surface acoustic wave propagates, where the number of pairs of electrode fingers in each IDT is 5.5, the number of electrode fingers in each reflector is 5, and the number of pairs of electrode fingers in each dummy electrode is 2.5. The dummy electrode has a structure including split electrode fingers.

In the input-side SPUDT 12, the total number of units including an IDT, and a reflector or a dummy electrode is set to 34. Among these, 14 units at the center belong to the groups including reflectors, while the rest of the units have dummy electrodes arranged therein, instead of reflectors. All the reflectors have a forward directivity.

Furthermore, in the input-side SPUDT 12, the distance between an IDT of a unit that includes a dummy electrode and an adjacent IDT is set to $3.5\lambda$, while the distance between an IDT of a unit that includes a reflector and the IDT of an adjacent unit is set to $3.5\lambda$.

Figure 7:
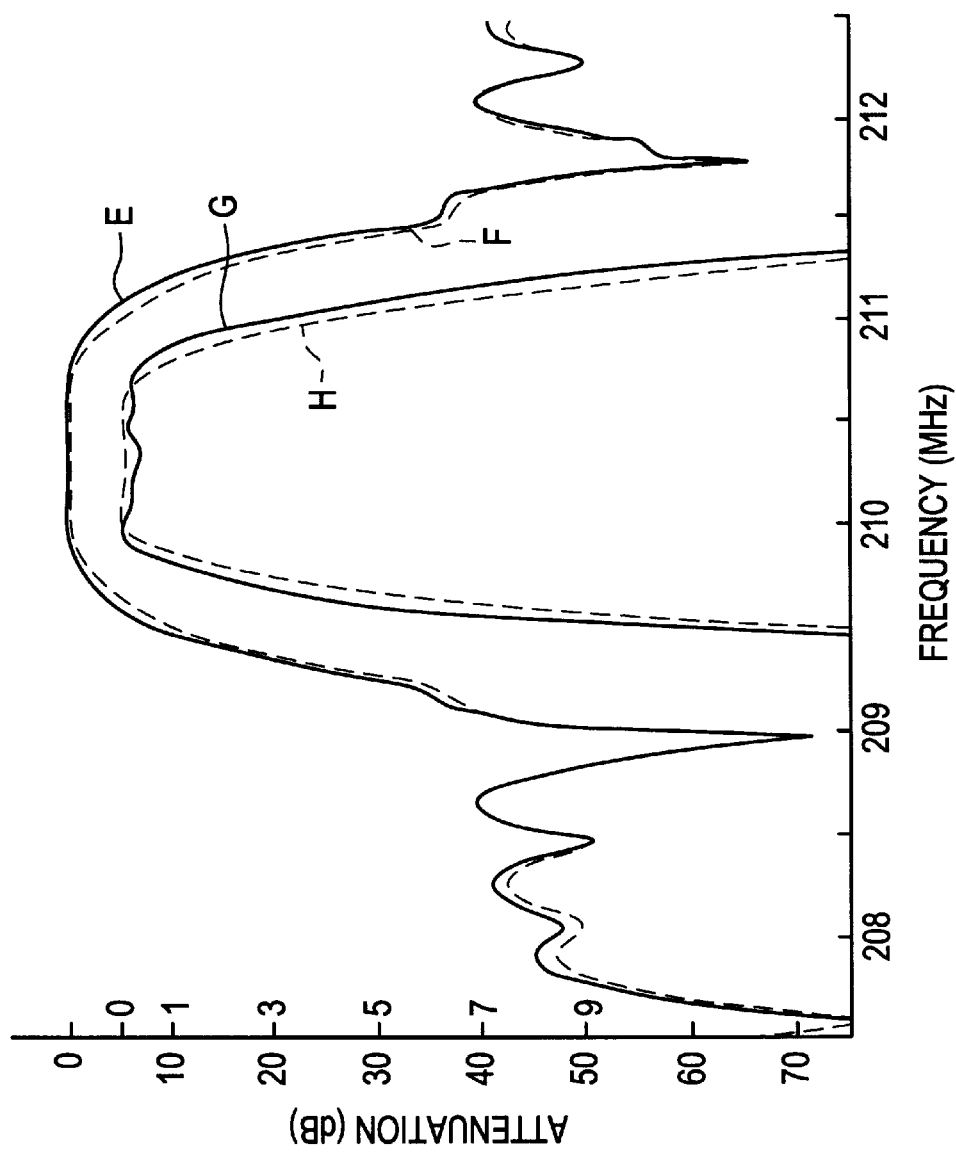
FIG. 7 is a graph showing attenuation-frequency characteristics of a surface acoustic wave filter equipped with the SPUDT of a preferred embodiment of the present invention and a surface acoustic wave filter equipped with a SPUDT prepared for comparison.

By measuring the characteristics of the surface acoustic wave filter 10, in which the input-side SPUDT 12 and the output-side SPUDT 13 were arranged as described above on the same piezoelectric substrate, attenuation-frequency characteristics, which are shown by a solid line E in FIG. 7 were obtained.

An example prepared for comparison to the above-described example of preferred embodiments of the present invention, except that the reflectors used in the output-side SPUDT were also all in the forward direction, a surface acoustic wave filter formed as in the case of the above preferred embodiment was prepared for measuring the transmission characteristics. FIG. 7 shows the results by a broken line F. A solid line G and a broken line H in FIG. 7 respectively indicate the enlarged main part of the transmission characteristics shown by a solid line E and a broken line F based on the scale of the right side of the vertical axis.

As FIG. 7 clearly shows, it is found that, compared to the surface acoustic wave filter which was prepared for comparison, in the surface acoustic wave filter 10 according to a preferred embodiment of the present invention, the width of the band, in which the attenuation with respect to the peak loss, where insertion loss in the proximity of the pass band is a minimum, is 33 dB, is almost the same, while the width of the band with an attenuation of 5 dB is greatly enlarged. Thus, this permits a change in attenuation between the pass band and the block band to be rapid, with the result of significantly improving selectivity.

More specifically, in the surface acoustic wave filter which was prepared for comparison, the width of the band with an attenuation of 5 dB was 1.41 MHz, while in the surface acoustic wave filter of the above preferred embodiment, it was 1.49 MHz. Generally, it is required that in a surface acoustic wave filter for use in the 1st IF for PCS, when the center frequency is 210.38 MHz, the width of 5 dB band should be not smaller than 1.26 MHz. Thus, it is found that in the case of the conventional surface acoustic wave, with respect to the required band width, the margin is only 0.15 MHz, while in the case of the surface acoustic wave filter according to preferred embodiments, it is enlarged to 0.23 MHz.

On the other hand, the width of the band with an attenuation of 33 dB was 2.20 MHz in the conventional surface acoustic wave filter, while it was 2.23 MHz in the preferred embodiment described above.

In the above surface acoustic wave filter used for the 1st IF for PCS, when the central frequency is 210.38 MHz, it is required that the 33-dB bandwidth not be larger than 2.5 MHz. Thus, compared to the required characteristics, the margin in the case of the conventional surface acoustic wave filter is 0.30 MHz, while that of the surface acoustic wave filter of the preferred embodiment is 0.27 MHz, wherein it is reduced only by 0.03 MHz. Accordingly, comparing to the ratio in which the margin in the 5-dB bandwidth is improved as in the case above, the degree of deterioration in the 33-dB bandwidth is very small. Accordingly, the surface acoustic wave filter of the preferred embodiment permits the manufacturing tolerance as a whole to be increased by 0.08 MHz, compared to the conventional surface acoustic wave filter.

Although the above preferred embodiment shows an example of a reflection-bank type SPUDT, the invention is also applicable to other types such as the EWC-type SPUDT and FDUDT, and provides the same advantages as those of the above-described preferred embodiment.

Moreover, in the transversal-type surface acoustic wave filter of preferred embodiments of the present invention, only the output-side SPUDT is provided with the reflectors having a forward directivity and the reflectors having a reverse directivity, as specifically shown in FIGS. 2–6. However, the transversal-type surface acoustic wave filter may include an input-side SPUDT and an output-side SPUDT both of which are provided with the reflectors having a forward directivity and the reflectors having a reverse directivity. In this case, it is to be noted that the forward and reverse directions of the input-side SPUDT are opposite to those of the output-side SPUDT, respectively. It is preferable, that the electrode structures of the input-side SPUDT and the output-side SPUDT are symmetrical with respect to the imaginary center line between the input-side SPUDT and the output-side SPUDT.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A unidirectional surface acoustic wave transducer, comprising:
   a piezoelectric substrate;
   a plurality of interdigital transducers disposed on the piezoelectric substrate;
   a plurality of reflectors disposed on the piezoelectric substrate;
   wherein the directivity of a first group of the plurality of reflectors is opposite to the directivity of a second group of the plurality of reflectors, and center positions of electrode fingers of the first group of the reflectors are shifted by about $\lambda/8$ in a first direction which is substantially perpendicular to the electrode fingers from a center position of electrode fingers of the interdigital transducers, where λ represents a wavelength corresponding to a center frequency of a surface acoustic wave excited by the transducer, while center positions of electrode fingers of the second group of the reflectors are shifted by about λ/8 from the center position of electrode fingers of the interdigital transducers in a second direction which is opposite to the first direction.

2. A surface acoustic wave transducer according to claim 1, further comprising a dummy electrode disposed between the plurality of interdigital transducers.

3. A transversal-type surface acoustic wave filter comprising:

a surface acoustic wave substrate;

an input-side unidirectional transducer provided on the surface acoustic wave substrate; and an output-side unidirectional transducer provided on the surface acoustic wave substrate in a direction in which a surface acoustic wave excited by the input-side unidirectional transducer propagates, the output-side unidirectional transducer including a plurality of interdigital transducers, a first reflector having a forward directivity and a second reflector having a reverse directivity;

wherein each of the first reflector, the second reflector, and the plurality of interdigital transducers comprises a plurality of electrode fingers, and center positions of the electrode fingers of the first reflector are shifted by about λ/8 from center positions of the electrode fingers of the interdigital transducers toward a side where the input-side unidirectional transducer is provided, where λ represents a wavelength corresponding to a center frequency of a surface acoustic wave excited by the transducer, while center positions of the electrode fingers of the second reflector are shifted by about λ/8 from the center position of the electrode fingers of the interdigital transducers toward a side where the input-side unidirectional transducer is not provided.

4. A transversal-type surface acoustic wave filter according to claim 3, wherein the first reflector is disposed between the input-side unidirectional transducer and the second reflector.

5. A transversal-type surface acoustic wave filter according to claim 3, wherein each electrode finger of the interdigital transducers comprises a pair of split electrode fingers, and the center position of the electrode fingers of the interdigital transducers is located at a center of the pair of split electrode fingers.

6. A transversal-type surface acoustic wave filter according to claim 5, further comprising a dummy electrode which includes a plurality of electrode fingers.

7. A transversal-type surface acoustic wave filter according to claim 6, wherein each of the electrode fingers of the first reflector, the second reflector and the dummy electrode are electrically connected at both ends thereof within the first reflector, the second reflector and the dummy electrode, respectively.

8. A transversal-type surface acoustic wave filter according to claim 3, wherein the input-side unidirectional transducer includes a plurality of interdigital transducers, a first reflector having a forward directivity and a second reflector having a reverse directivity.

* * * * *